United States Patent [19]
Namordi et al.

[11] Patent Number: 5,337,027
[45] Date of Patent: Aug. 9, 1994

[54] MICROWAVE HDI PHASE SHIFTER

[75] Inventors: Mooshi R. Namordi; Mark R. Lang, both of Fayetteville; Michael J. Fithian, Liverpool, all of N.Y.

[73] Assignee: General Electric Company, Philadelphia, Pa.

[21] Appl. No.: 992,808

[22] Filed: Dec. 18, 1992

[51] Int. Cl.$^5$ .............................................. H03H 7/18
[52] U.S. Cl. ...................................... 333/161; 333/164
[58] Field of Search ............... 323/212, 213, 214, 217, 323/218; 333/139, 161, 164

[56] References Cited

U.S. PATENT DOCUMENTS

| | | | |
|---|---|---|---|
| 4,035,807 | 7/1977 | Tang et al. | 343/742 |
| 4,578,629 | 3/1986 | Degenford et al. | 323/217 |
| 4,599,585 | 7/1986 | Vorhaus et al. | 333/164 |
| 4,967,172 | 10/1990 | Ariel et al. | 333/161 |
| 5,021,758 | 6/1991 | Lane | 333/245 |
| 5,032,806 | 7/1991 | Nakahara | 333/161 |
| 5,128,639 | 7/1992 | Ueda et al. | 333/164 |

OTHER PUBLICATIONS

Final Report-Contract No. F30602-87-C-0188. Jun. 1990. Prepared for Rome Air Development Center, Griffis AFB, N.Y. Submitted by GE Electronics Laboratory, Syracuse, N.Y.

*Primary Examiner*—R. Skudy
*Assistant Examiner*—Adolf Berhane
*Attorney, Agent, or Firm*—Geoffrey H. Krauss

[57] ABSTRACT

A microwave phase shifter has a plurality of sequentially arranged, independently-actuatable sections, the total phase shift is the sum of all of the sections. The phase shifter has a common substrate, supporting several switching elements, with at least one switching element being assigned to each phase section; the switching elements are fastened to the common substrate with the element connections are all substantially in a first plane above the substrate. A first layer of a dielectric material is affixed adjacent to the first plane. Phase shift elements, such as microstriplines of a known length or inductive patterns of conductor, imparting the desired section phase shift, are fabricated upon a surface of the first dielectric layer furthest from the substrate, and are interconnected to and from the sections, or onto or off of the phase shifter at this level. Connections between the phase-shift elements and the switching element connection pads are by conductive pathways in this plane, with conductive vias formed through the intervening dielectric material. An additional dielectric layer is placed over the phase element conductive patterns, both for element protection and to support either control wiring, which can be routed as required in another surface plane and connected down to the control connection pads using other via connections, and/or for supporting a ground plane helping to define microstripline phase-shift elements.

17 Claims, 2 Drawing Sheets

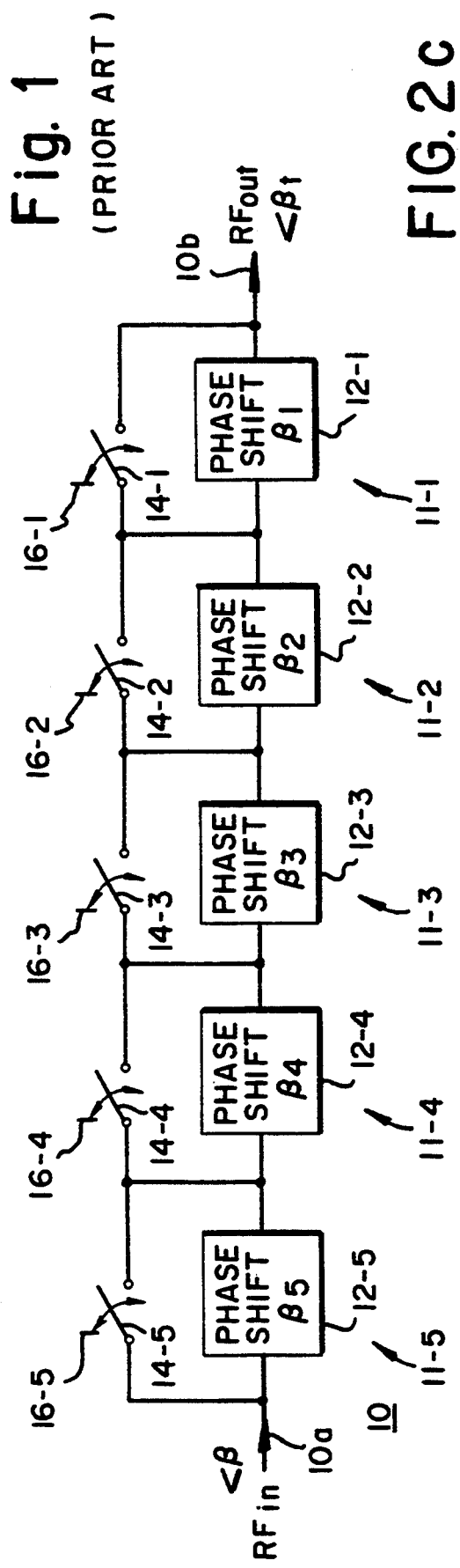
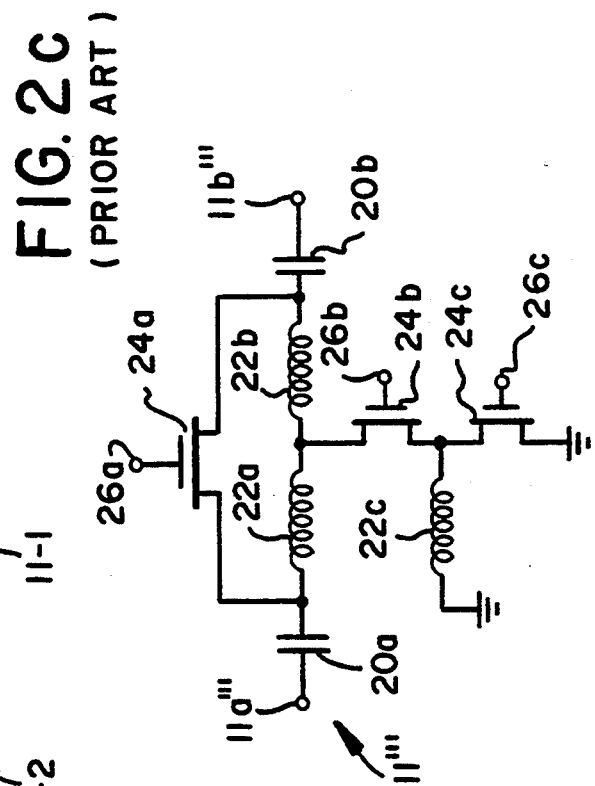
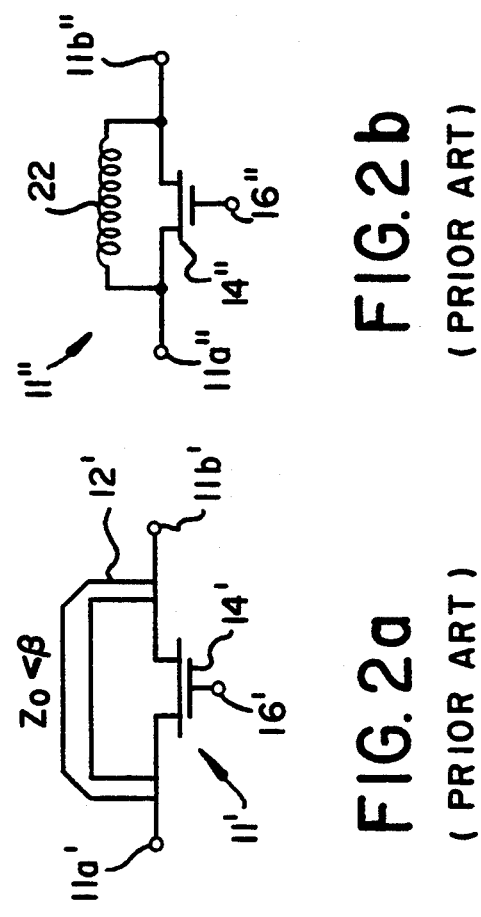

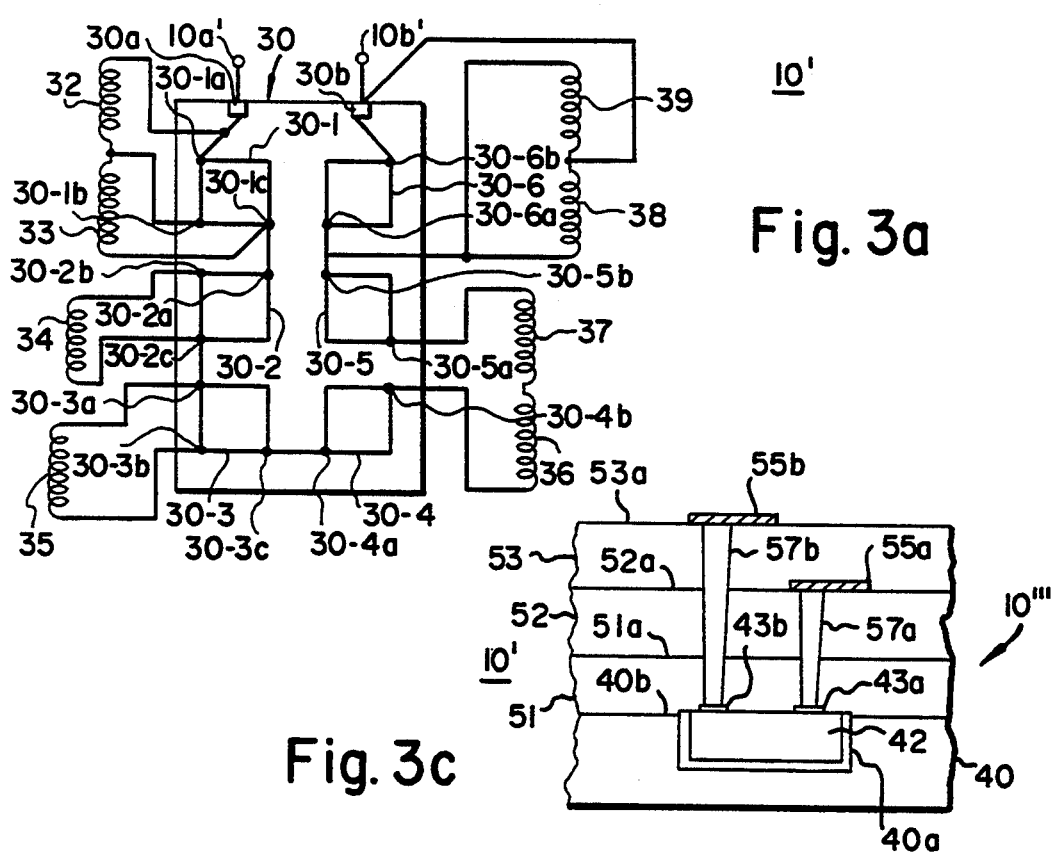
Fig. 3a
Fig. 3c
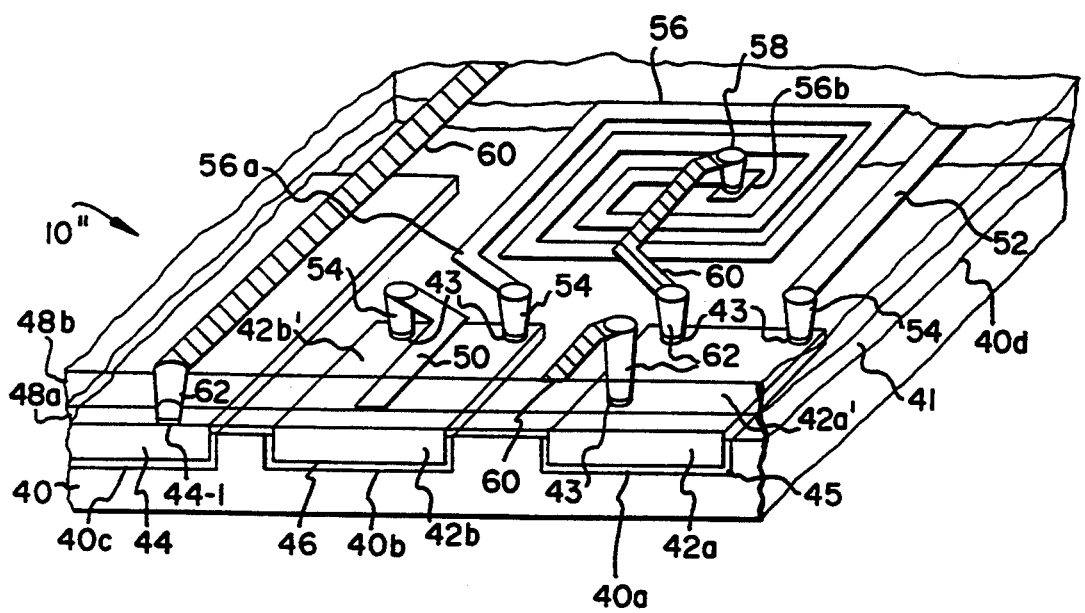
Fig. 3b

MICROWAVE HDI PHASE SHIFTER

BACKGROUND OF THE INVENTION

The present invention relates to microwave phase shifters and, more particularly, to a novel microwave phase shifter utilizing high-density-interconnection (HDI) technology.

It is now well-known to shift the phase of the radiation emitted at each of a multiplicity of sites in an array, to steer a beam of that radiation to a particular point in space and focus the beam steered thereto. The phase shift introduced at each array site is generally reciprocal, i.e. is imparted both to the transmitted energy to form the interrogating beam, and to the received energy to form a beam coherently obtained from only one location in space. The phase shifter should have minimal loss in both the transmission and reception conditions, to respectively maximize radiation efficiency (especially when large transmission powers are used) and to minimize reception noise figure.

One regime where low-loss phase shifters have been well received is in microwave phased array radar; a typical radar system may use several hundreds, or even thousands, of identical transmission/reception modules, each placed at one site in an ordered array of such sites, and all operating together, with individually-assigned and implemented module phase shifts, to form the transmission and reception microwave energy beam. One example of the required module is described in a June 1990 Final Report for an "Advanced L-Band Module" developed under U.S. Air Force Contract F30602-87-C-0188; the phase shifter here was implemented in a monolithic microwave integrated circuit (MMIC) which had low total yield—the visual yield was about 13%, even though the subsequent electrical yield was somewhat higher, at about 24%. It is highly desirable to provide a microwave phase shifter having a different construction, so as to improve the yield, while reducing the insertion losses of the circuit, to increase efficiency and minimize noise figure.

BRIEF SUMMARY OF THE INVENTION

In accordance with the invention, a novel microwave phase shifter has a plurality of sequentially-arranged sections, each independently actuatable for shifting the phase of a microwave signal passing therethrough by either a reference phase or by a substantially fixed, non-zero phase; the total phase shift is the sum of the individual phase shifts through the entire series of sections. The phase shifter has a common substrate, supporting a plurality of switching elements, with at least one switching element being assigned to each phase section; the switching elements are fastened to the common substrate in manner such that the element connections are all substantially in a first plane, above the substrate. A first layer of a dielectric material is affixed adjacent to the first plane. Phase shift elements, such as microstriplines of a known length or inductive patterns of conductor, imparting the desired section phase shift, are fabricated upon a surface of the first dielectric layer furthest from the substrate, and are interconnected to and from the sections, or onto or off of the phase shifter at this level. Connections between the phase-shift elements and the switching element connection pads are by conductive pathways in this plane, with conductive vias formed through the intervening dielectric material. An additional dielectric layer is placed over the phase element conductive patterns, both for element protection and to support either control wiring, which can be routed as required in another surface plane and connected down to the control connection pads using other via connections, and/or for supporting a ground plane helping to define the microstripline phase-shift elements. Large conductor sizes and thicknesses can be provided to minimize overall phase shifter size and loss, while maximizing efficiency and reducing noise figure.

In one presently preferred embodiment, each phase-shift section comprises at least one phase-shift inductance element, with either switching MESFETs or PIN diodes. A plurality of the switching elements are integrated into a single chip, with the one or more chip(s) being mounted on the common substrate and overlaid with a first polyimide dielectric layer on which the various shift inductances are formed.

Accordingly, it is one object of the present invention to provide a novel microwave phase shifter formed in a HDI module.

This and other objects of the present invention will become apparent to those skilled in the art upon reading the following detailed description of preferred embodiments, when considered in conjunction with the associated drawings.

BRIEF DESCRIPTION OF THE DRAWINGS

FIG. 1 is a schematic block diagram of a generic microwave phase shifter;

FIGS. 2a, 2b and 2c are schematic diagrams of one phase-shifter section, respectively using a microstripline of controlled phase length, a single inductance, and a combination of separate inductances;

FIG. 3a is a schematic diagram of a microwave phase shifter using separate stage inductances with all stage switching elements integrated in to a single chip;

FIG. 3b is a perspective view of one embodiment of a HDI microwave phase shifter in accordance with the principles of the present invention; and FIG. 3c is a sectional side view of a portion of another embodiment of a HDI microwave phase shifter in accordance with the principles of the present invention.

DESCRIPTION OF PREFERRED EMBODIMENTS

Referring initially to FIG. 1, a multistage RF phase shifter 10 receives an incoming radio-frequency signal $RF_{in}$, at a reference phase angle defined to be 0°, at an input 10a, and shifts the phase of that signal by some total shift angle $\beta_t$, to obtain an output signal $RF_{out}$ at a shifter output 10b. The shifter 10 comprises a plurality N of individual shift stages 11-1 through 11-n, each for either selectively shifting the stage input signal by a stage shift $\beta_n$ (typically equal to $360°/2^n$) in an n-th phase shift stage 12-n (when an associated n-th stage parallel switching element 14-n is in the open-circuit condition responsive to a first state of a control signal at a stage switch control input 16-n), or for transporting the signal through that stage without significant phase shift (when the parallel switching element 14-n is in the closed-circuit condition, responsive to the appropriate signal at stage switch control input 16-n). Each stage phase shift element 12-n can be any network capable of providing the desired phase shift for that stage, at the intended frequency of operation. As one example, a N=5 stage phase shifter 10 will have five separate phase shift increments, which may be binary-related, e.g. $\beta_1=180°$, $\beta_2=90°$, $\beta_3=45°$, $\beta_4=22.5°$ and $\beta_5=11.25°$, each of which phase shift increments may be individually present or absent, to additively approximate any desired phase shift between 0° (all switches 16 closed) to almost 360° (i.e. 348.75° with all parallel switches 16 open).

As seen in FIG. 2a, one circuit for providing a particular stage 11' phase shift $\beta$ is to provide a transmission path element 12', such as a stripline, microstripline and the like, having a known impedance $Z_0$ and a length selected to induce the desire phase change at a particular 30 frequency of the signal at input 11'a. The phase shift occurs if the parallel switching element, here a MESFET 14', is open-circuited (cut-off) by receipt of the appropriate control signal at its control electrode 16'. When the electrode 16' signal is changed to place the MESFET switch in the closed-circuit ("on") condition, the phase shift element 12' is effectively short-circuited and, if the electrical length of the MESFET source-drain channel and associated connections are sufficiently short, a substantially zero phase shift is introduced between stage input 11'a and stage output 11'b.

The same effective phase shift can be obtained (FIG. 2b) by use of a selected inductance 22 instead of the transmission line element 12'. For realization of certain magnitudes of stage phase shift, a more complex circuit (FIG. 2c), using a plurality of inductances 22 (e.g three inductors 22a, 22b and 22c) may be needed; a plurality of switching elements (e.g. three MESFETs 24a, 24b and 24c, each with a different control electrode 26a, 26b or 26c) and a plurality of capacitors (e.g. capacitors 20a and 20b) may be required for proper RF/microwave operation of that stage.

In accordance with one aspect of the present invention, a plurality of the switching elements, whether three-terminal devices such as MESFETs and the like, or two-terminal devices such as PIN diodes and the like, can be provided on a single MMIC chip 30. Thus, semiconductor chip 30 illustratively has six switching elements 30-1 through 30-6, interconnected between a shifter chip input 30a and a shifter chip output 30b. Each element has a plurality of contact pads, so that the first element 30-1 has connection points 30-1a through 30-1c, while second element 30-2 has connection points 30-2a through 30-2c, third element 30-3 has connection points 30-3a through 30-3c, and so forth. The phase shifter apparatus 10' is now a six stage unit, with a minimum phase shift increment of 5.625°. Each shift stage uses a single inductance; the various stage inductors 32–39 are connected, arranged adjacent, to the associated switching element (and generally perpendicular to the immediate neighboring inductors). Thus, the entire phase shifter 10' is provided by arranging at least one switching element chip 30 and the necessary off-chip inductances 32–39, in a single plane, interconnected between the phase shifter input 10'a and output 10'b. The chip 30 can be made as small as practical, commensurate with the power levels to be controlled and the complexity of the switching elements and their control requirements, to minimize loss and residual phase shift. As the inductors are not on the chip, the inductors can be formed of larger surface-area metallization patterns, to decrease loss while still providing the necessary inductance.

Referring now to FIG. 3b, one presently preferred embodiment of a phase shifter 10" in accordance with another aspect of the invention (shown here as a portion of a more-complex assembly) is formed using High-Density Interconnect (HDI) technology (such as is more fully discussed in U.S. patent application Ser. No. 07/962,000, filed Oct. 16, 1992 and the HDI patents and applications enumerated therein, as well as in U.S. application Ser. No. 07/546,965, filed Jul. 2, 1990 and applications enumerated therein, all of which are incorporated herein in their entireties by reference). A wafer or substrate 40 of suitable material is provided and is patterned to form each of a plurality of chip-retaining wells 40a/40b/40c into the substrate through a substrate surface 40d. The surface 40d and the surfaces of one or more wells may bear a ground plane 41 metallization. A separate semiconductor die or chip 42/44 (MMIC, digital IC, single device die and the like) is deposited in each well 40 and retained therein by an adhesive 45, which may be electrically conductive, if the lower chip surface is one electrode of the chip, and may also be heat conductive. Thus, one of first and second PIN diode chips 42a and 42b is provided in each of wells 40a and 40b; the chip may contain a single diode or a plurality of diodes. The diodes selected for use as shunt elements, with one terminal connected to electrical ground, may have the ground electrode connected through the die 42, to the ground plane 41, with a connection pad 43 for each non-common electrode(s) lying on the die upper surface 42a' or 42b'; all diodes used as series elements have connection pads 43 for both electrodes lying on the die upper surface 42a'/42b'. A digital control chip 44 can be likewise placed in its own well 40c, have its common electrode connected to 25 ground through conductive adhesive 45 and have all of its terminal pads (e.g pad 44-1) on its upper surface.

A first layer 48a of a suitable dielectric material, e.g. Kapton ® and the like, is fabricated upon the upper die surfaces. RF/microwave conductive interconnections 50/52 are fabricated upon the upper surface of first layer 48a; conductive vias 54 are formed through the layer 48a, at the sites of chip electrode pads 43, and interconnect each device terminal pad 43 and the associated one of interconnection leads 50 and/or input-/output leads 52. A second dielectric layer 48b is fabricated upon the interconnect-bearing surface of the first layer 48a, after all leads 50/52 have been deposited. The stage phase shift element, here an inductance element 56, is also fabricated upon the first layer top surface; here, the inductor is a spiral formation, having an outer first end 56a connected to a via 54 leading to one terminal pad 43 of a PIN diode die 42b, and having an inner second end 56b. To form the bridge between inner inductor end 56a and the associated PIN diode terminal pad 43 at die 42a, a via 58 is formed through both dielectric layers 48a/48b, to connect to a conductor 60 formed on the upper surface of the second layer 48b; the other end of lead 60 connects to another via 62 formed through both dielectric layers 48a/48b, down to the desired electrode pad 43 of device die 42a. The low frequency connections 60 (for, e.g., control, logic, DC power and the like) are routed on the surface of a different layer (e.g. the second layer 48b) from the layer 48a surface on which the higher frequency signals are generally routed; the higher surface leads (shown with hatching in FIG. 3b) may provide higher frequency interconnections if topologically necessary for crossovers and the like. Similarly, if a microstripline phase shift element 12' is desired, the ground plane associated therewith may be placed in the second layer surface plane (or even in the plane of an upper surface of an additional third layer (not shown). It will be seen that a very compact circuit arrangement is realized, having relatively wide leads; the wider the leads and the smaller the physical size, the less the stage loss and the smaller the reception noise figure.

Referring now to FIG. 3c, another presently preferred embodiment of a phase shifter 10''' in accordance with another aspect of the invention (shown here as a portion of a more-complex assembly) is again formed using microwave HDI technology; a substrate 40 has a semiconductor chip 42 (which may contain a single device, e.g. a diode, or a plurality of devices) retained in a substrate well 40a, with a plurality (here, three) of different layers 51/52/53 of dielectric material(s). Each dielectric layer is placed on the surface of the underlying one of the substrate 40 or previous dielectric layer; thus, first dielectric layer 51 is fabricated on substrate surface 40b, the upper surface 42a of the chip and the connection pads 43 thereon, while second layer 52 is fabricated on first layer upper surface 51a, and third layer 53 is fabricated on the upper surface 52a of the second layer. Illustratively, the phase-shift elements 55 can be placed on the surface of any desired one, or combination, of the dielectric layer surfaces; here, one phase-shift element 55a is fabricated on the second layer surface 52a, and is connected to IC connection pad 43a by means of a conductive via 57a, passing through the first and second layers 51/52, while another phase-shift element 55b is fabricated on the third layer surface 52b, and is connected to IC connection pad 43b by means of a different conductive via 57b, passing through all of the first, second and third layers 51/52/53. The low frequency connections can be routed over other portions of these layers, or on other layer surfaces; ground plane(s) associated with the microwave elements may be placed in underlying/overlying locations on the surface of appropriate ones of the layers, as required to shield the various signals from one another. It will be seen that a very compact circuit arrangement is again realized.

While several presently preferred embodiments of our novel Microwave HDI Phase Shifter apparatus are described herein in some detail, those skilled in the art will now realize that many modifications and variations can be provided without departing from the concepts of our invention. It is our intent, therefore, to be limited solely by the scope of the appending claims, and not by any details or instrumentalities presented herein by way of explanation.

What we claim is:

1. Apparatus for providing an output radio-frequency (RF) signal having a phase controllably varied from a reference phase of an input RF signal, comprising:
   a common substrate;
   a plurality of phase-shifting stages each having at least one switching element formed in a semiconductor die which is separately attached to the common substrate;
   a first layer of a dielectric material covering at least a portion of said common substrate and said switching elements, said first layer having a surface;
   at least one non-monolithic phase-shift element for each stage, each having at least one conductive element fabricated upon said first layer surface but not in any portion of said semiconductor die, and having first and second element ends; and
   via means extending through said first layer dielectric material to interconnect each one of said element ends and an associated switching element on said semiconductor die.

2. The apparatus of claim 1, wherein a plurality of stage switching elements are integrated into a single semiconductor chip attached to said substrate.

3. The apparatus of claim 2, wherein all switching elements of the apparatus are integrated into a single die.

4. The apparatus of claim 1, wherein at least one switching element is a MESFET.

5. The apparatus of claim 1, wherein at least one switching element is a PIN code.

6. The apparatus of claim 1, further comprising a second layer of a dielectric material covering at least a portion of both said first layer and any conductive elements fabricated upon said first layer surface, said second layer having a surface furthest from said first layer; means, fabricated upon said second layer surface, for forming other conductive elements; and other via means extending through the dielectric material of at least one of said first and second layers to interconnect each one of said other conductive elements and an associated one of connections at either the first layer surface or one of the switching elements.

7. The apparatus of claim 6, wherein at least one phase shift element includes a spiral inductor having a first end connectable by conductive elements on said first layer surface, and a second end connectable by a bridging conductive element on said second layer surface.

8. The apparatus of claim 1, further comprising IC means for controlling the plurality of stage switching elements, said IC means separately attached to said substrate.

9. The apparatus of claim 8, wherein said IC means and said switching elements are at least partially interconnected by conductive means fabricated upon the second layer surface.

10. The apparatus of claim 1, wherein at least one stage phase shift element is a transmission line.

11. The apparatus of claim 10, wherein the transmission line is a stripline.

12. The apparatus of claim 10, wherein the transmission line is a microstripline.

13. The apparatus of claim 1, wherein at least one stage phase shift element is an inductor.

14. The apparatus of claim 13, wherein at least one stage has a plurality of inductors as phase shift elements for realize a single stage phase shift.

15. The apparatus of claim 14, wherein the stage having a plurality of inductors also utilizes a plurality of stage switching elements.

16. The apparatus of claim 1, wherein interconnection means for forming apparatus input/output leads are fabricated upon the first layer surface.

17. The apparatus of claim 1, further comprising at least a second layer of a dielectric material covering at least a portion of said first layer, with each layer having a surface furthest from said substrate; and wherein each of the phase-shift elements can be fabricated upon the surface of any selected one of the plurality of layers; and including other via means, extending through the dielectric material of all interposed dielectric layers, for interconnecting an end of each phase-shift element to an associated connection location adjacent to another surface.

* * * * *